(12) United States Patent
Kim

(10) Patent No.: US 7,929,264 B2
(45) Date of Patent: Apr. 19, 2011

(54) ELECTRO-STATIC DISCHARGE PROTECTION DEVICE HAVING A LOW TRIGGER VOLTAGE AND REDUCED SIZE

(75) Inventor: Jang Hoo Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 159 days.

(21) Appl. No.: 12/062,690

(22) Filed: Apr. 4, 2008

(65) Prior Publication Data

US 2008/0247103 A1 Oct. 9, 2008

(30) Foreign Application Priority Data

Apr. 5, 2007 (KR) .................. 10-2007-0033902

(51) Int. Cl.
*H02H 9/00* (2006.01)
*H02H 3/22* (2006.01)

(52) U.S. Cl. .................................. 361/56; 361/111

(58) Field of Classification Search .............. 361/56, 361/111
See application file for complete search history.

(56) References Cited

U.S. PATENT DOCUMENTS

| 6,411,480 | B1 * | 6/2002 | Gauthier et al. | 361/56 |
| 6,560,081 | B1 * | 5/2003 | Vashchenko et al. | 361/56 |
| 6,829,126 | B2 * | 12/2004 | Lee et al. | 361/56 |
| 7,068,482 | B2 * | 6/2006 | Chen | 361/56 |
| 7,233,475 | B1 * | 6/2007 | Chen | 361/111 |

FOREIGN PATENT DOCUMENTS

| KR | 1020050022879 A | 3/2005 |
| KR | 1020060094410 A | 8/2006 |
| KR | 1020060098538 A | 9/2006 |
| KR | 1020060122813 A | 11/2006 |

* cited by examiner

*Primary Examiner* — Jared Fureman
*Assistant Examiner* — Lucy Thomas
(74) *Attorney, Agent, or Firm* — Ladas & Parry LLP

(57) ABSTRACT

The present invention describes an electro-static discharge protection device that has a low operation voltage and a reduced size. The electro-static discharge protection device includes a power clamp unit that provides a discharge path between a pair of power lines. The power clamp unit includes a trigger unit generating a trigger voltage corresponding to electrostaticity accumulated in a first power line. The power clamp device is switched by the trigger voltage of the trigger unit to form a discharge path to discharge the electrostaticity in the first power line to a second power line. The power clamp device may include an NMOS transistor connected to a gate and a bulk. The power clamp device may also include a resistor for dropping the trigger voltage to apply it to the bulk.

7 Claims, 7 Drawing Sheets

ELECTRO-STATIC DISCHARGE PROTECTION DEVICE HAVING A LOW TRIGGER VOLTAGE AND REDUCED SIZE

CROSS-REFERENCE TO RELATED APPLICATIONS

The present application claims priority to Korean patent application number 10-2007-0033902 filed on Apr. 5, 2007, which is incorporated herein by reference in its entirety.

BACKGROUND OF THE INVENTION

The present invention relates to an electro-static discharge protection device, and more particularly to an electro-static discharge protection device having a low operation voltage.

Generally, a semiconductor apparatus has an electro-static discharge protection circuit located between a pad and an internal circuit for protecting the internal circuit.

The electro-static discharge protection circuit prevents a discharge phenomenon where electrostaticity is discharged to the internal circuit or is discharged externally from the internal circuit through a pad when an external pin of an integrated circuit contacts a human body or a charged machine.

A power clamp unit, as shown in FIG. 1, is used to prevent damage to the internal circuit due to the external discharge of charges from the internal circuits by maintaining a constant power voltage and ground voltage.

The power clamp unit has an NMOS transistor N1 connected between a power voltage line VDD and a ground voltage line GND. If electrostaticity is inputted from the ground voltage line, the NMOS transistor N1 is turned on to discharge the electrostaticity to a power pad through the power voltage line.

However, as semiconductor apparatuses become more highly integrated and have a lower operation voltage, a problem arises in that an internal circuit is damaged even under a low electrostatic voltage.

Meanwhile, FIGS. 2 and 3 show circuits designed for performing a CDM (Charged Device Model) to prevent electrostaticity externally discharged from the internal circuit from affecting the internal circuit.

FIG. 2 shows a capacitor C1 and a resistor R1 connected in series between the power voltage line VDD and the ground voltage GND line for lowering a trigger voltage of the NMOS transistor N1 of FIG. 1.

The power clamp unit of FIG. 2 applies a coupling voltage generated between the capacitor C1 and the resistor R1 to the NMOS transistor N1 to lower the trigger voltage of the NMOS transistor N1. The capacitor C1 may be replaced with a PMOS transistor forming a capacitor C2 as shown in FIG. 3.

However, the power clamp unit illustrated in FIGS. 2 and 3 should have a large capacitor of several pF (picofarad) for securing sheet resistance, which becomes smaller as the power clamp unit becomes more highly integrated, so that it has a problem that a large area is allocated.

SUMMARY OF THE INVENTION

An aspect of the present invention is to provide an electro-static discharge protection device having a low trigger voltage and a lay-out area suitable for a highly integrated semiconductor apparatus.

An electro-static discharge protection device includes a power clamp unit that provides a discharge path between a pair of power lines, the power clamp unit comprising: a trigger unit that generates a trigger voltage corresponding to electrostaticity accumulated in a first power line; and a power clamp device that is switched by the trigger voltage to form the discharge path discharging electrostaticity in the first power line to the second power line.

Among others, the power clamp device may comprise an NMOS transistor connected to a gate and a bulk.

The power clamp device may comprise a resistor dropping the trigger voltage to apply it to the bulk.

Herein, the resistor may be connected between the bulk of the NMOS transistor and the second power line.

Meanwhile, the trigger unit preferably comprises a driving device that detects the minimum electrostaticity and then provides driving current corresponding thereto; and a current amplifying device providing the trigger voltage turned on by the driving current to amplify the electrostaticity to the bulk and gate of the NMOS transistor.

Among others, the driving device may comprise one or more diode chains connected in series.

Also, the number of diodes in the diode chain may be configured to have a larger threshold voltage than the operation voltage of the internal circuit.

Meanwhile, the current amplifying device may comprise a bipolar transistor which emitter is connected to the first voltage line and a collector may be connected to the bulk.

The current amplifying device may comprise a PNP bipolar transistor.

Preferably, the first power line is a power voltage line and the second power line is a ground voltage line.

An electro-static discharge protection device of the present invention comprises: a P-type sub-substrate isolatedly formed with first to fourth active regions, formed with one or more diodes by isolatedly forming a plurality of N-type sub-wells in the first active region and making a P-type junction thereon, a bipolar transistor by making the N-type sub-wells and the P-type junction thereon in the second active region, a MOS transistor by forming N-type junction regions isolated from a gate channel in the third active region, and a resistor by isolating the fourth active region with a device isolating film and forming a P-type junction region on the both isolated regions; a first voltage line connected to a chain of diodes in the first active region, one end of the bipolar transistor, and one end of the MOS transistor; and a second power line wherein the other end of a chain of the diodes is connected to a second N well region of the bipolar transistor, the other end of the bipolar transistor is connected to a metal of the MOS transistor, and a substrate of the MOS transistor is connected to the substrate resistor.

An electro-static discharge protection device of the present invention comprises: a P-type sub-substrate isolatedly formed with first to fourth active regions, formed with one or more diodes by isolatedly forming a plurality of N-type sub-wells in the first active region and making a P-type junction thereon, a bipolar transistor by making the N-type sub-wells and the P-type junction thereon in the second active region, a MOS transistor by forming N-type junction regions isolated from a gate channel in the third active region, and a resistor formed between junction regions of both isolated sides, the fourth active region is formed with the N-type sub-wells; a first voltage line connected to a chain of diodes in the first active region, one end of the bipolar transistor, and one end of the MOS transistor; and a second power line wherein the other end of a chain of the diodes is connected to a second N well region of the bipolar transistor, the other end of the bipolar transistor is connected to a metal of the MOS transistor, and a substrate of the MOS transistor is connected to the substrate resistor.

DESCRIPTION OF SPECIFIC EMBODIMENTS

Hereinafter, preferred embodiments of the present invention will be described in detail with reference to the accompanying drawings.

Figure 1:
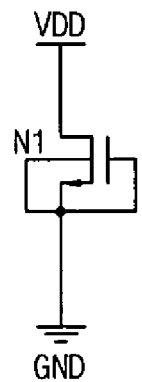
FIG. 1 is a circuit view showing an electro-static discharge protection device according to the prior art.
Figure 2:
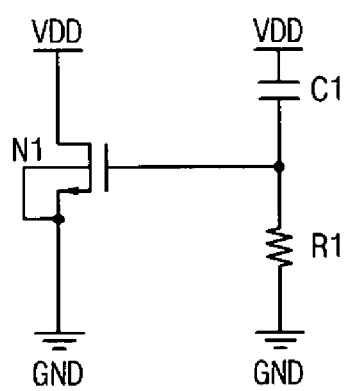
FIG. 2 is a circuit view showing an electro-static discharge protection device according to another example of the prior art.
Figure 3:
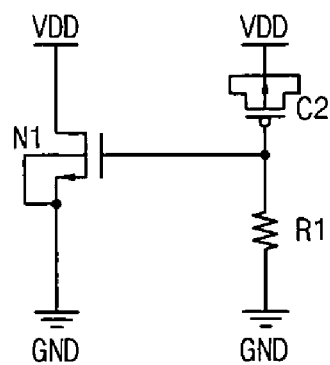
FIG. 3 is a circuit view showing an electro-static discharge protection device according to still another example of the prior art.
Figure 4:
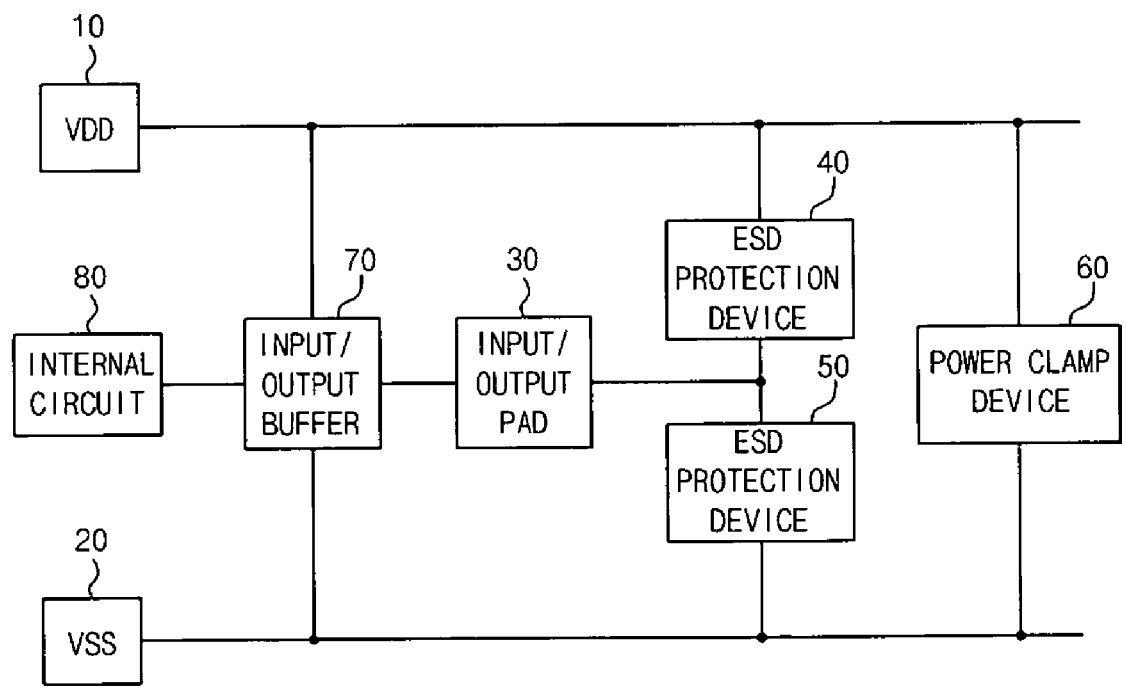
FIG. 4 is a circuit view including an electro-static discharge protection device according to a technique of the present invention.

FIG. 4 is a block view showing an electro-static discharge protection circuit between an internal circuit comprising an electro-static discharge protection device and an input/output pad.

First, when electrostaticity is inputted from an input/output pad 30, ESD protection devices 40 and 50 that are connected to the input/output pad 30 discharge the electrostaticity to a power voltage line connected to a power voltage pad 10 and a ground voltage line connected to a ground voltage pad 20.

A power clamp unit 60 serves to discharge the electrostaticity of the power voltage line and the ground voltage line to the ground voltage pad 20 or the power voltage pad 10.

When a normal signal is applied from the input/output pad 30, an input/output buffer 70 that is connected between the power voltage line and the ground voltage line is connected to the input/output pad 30 to amplify the applied signal. The amplified signal is inputted to an internal circuit 80 connected to the input/output buffer 70.

Figure 5:
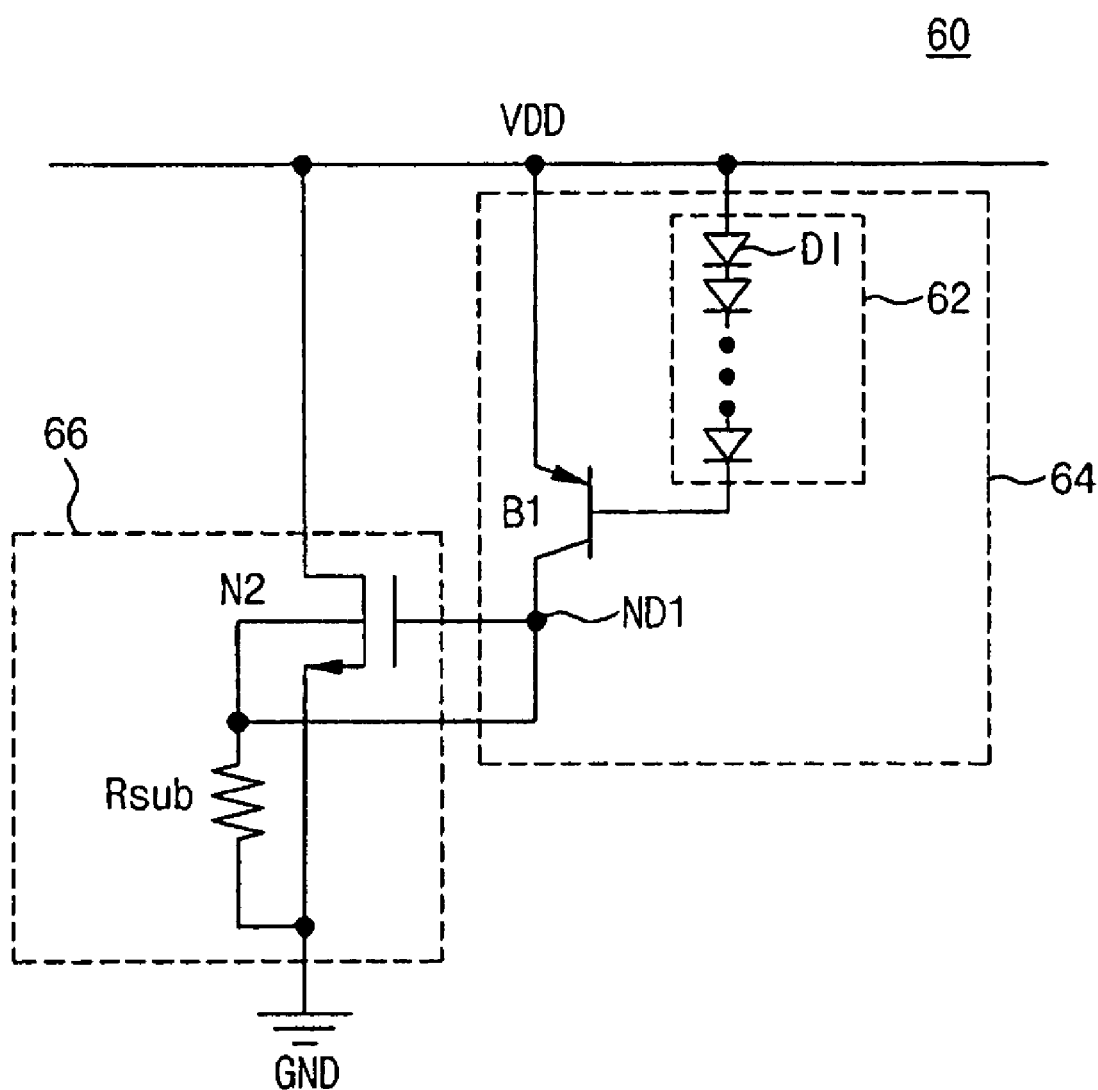
FIG. 5 is a circuit view of an electro-static discharge protection device according to an embodiment of the present invention.

Herein, the power clamp unit 60 of FIG. 4 may comprise a device having a low operating voltage comprising a trigger unit 64 as seen in FIG. 5.

Specifically, an NMOS transistor N2, which is a power clamp device between the power voltage line and the ground voltage line, and a trigger unit 64 for dropping a voltage to a gate of the NMOS transistor N2 is shown.

The trigger unit 64 is connected to the gate of the NMOS transistor N2 through a PNP bipolar transistor B1 provided between the power voltage line and a node ND1. The trigger unit 64 applies electrostatic current inputted through the power voltage line to a base of the PNP bipolar transistor B1 through a diode chain 62 connected to the power voltage line.

Herein, the diode chain 62 may be formed by connecting at least one diode DI in series. The number of diodes forming the diode chain 62 may be formed to have an operation voltage that is at least higher than the power voltage VDD.

For example, if the power voltage VDD is 1.2V, the diode chain may be formed by using two diodes of 0.7V each. If the power voltage VDD is 1.8V, the diode chain may be formed by using three diodes of 0.7V each.

Meanwhile, the NMOS transistor N2 applies the voltage dropped by the trigger unit 64 through the node N1 to a gate and a bulk. The voltage drop generated from the bulk by a substrate resistor Rsub further lowers a trigger voltage of the NMOS transistor N2.

Figure 6:
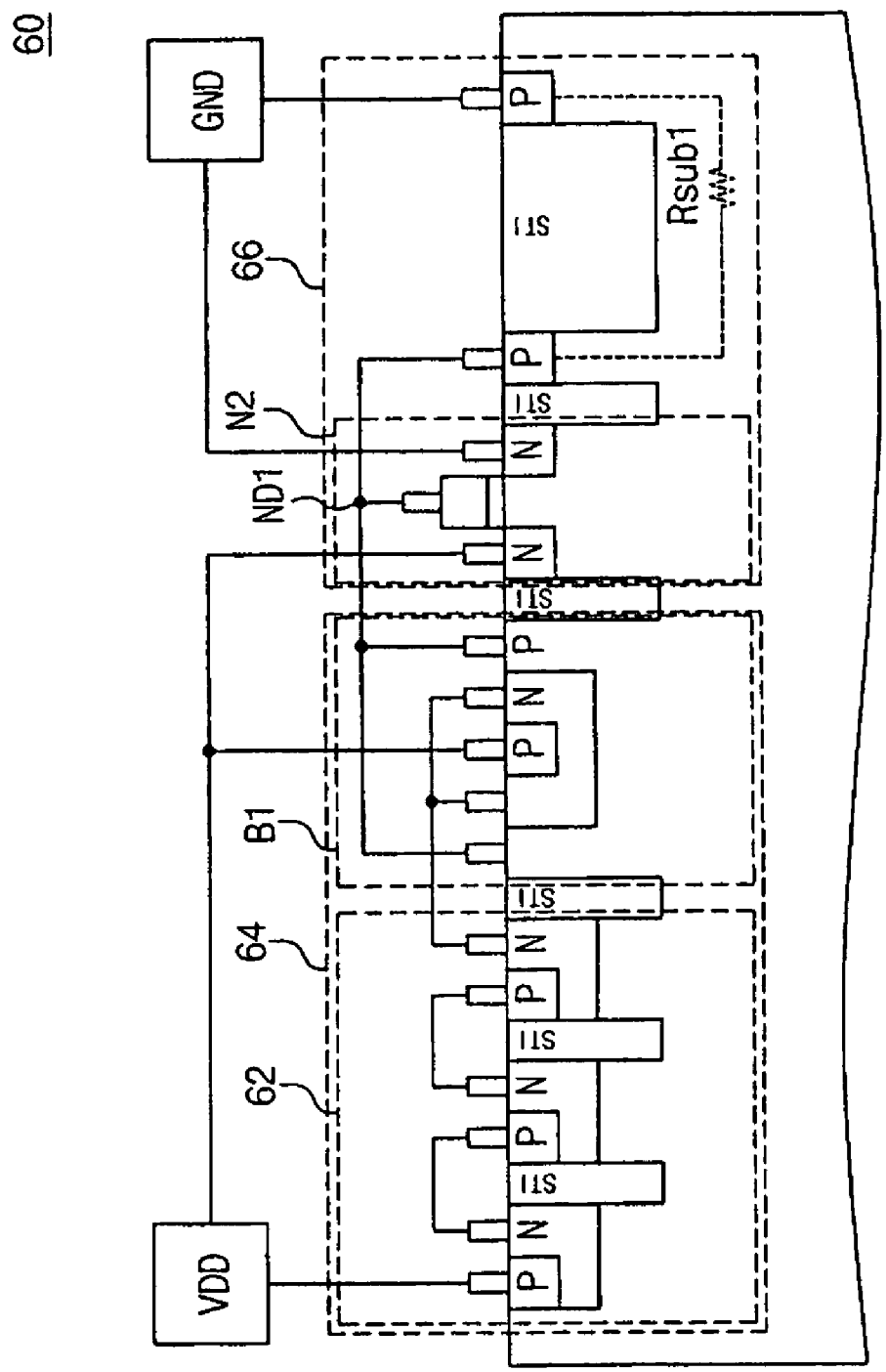
FIG. 6 is a cross-sectional view of the electro-static discharge protection device of FIG. 5a as formed according to an embodiment of the present invention.

FIG. 6 illustrates a cross-sectional view of a power clamp unit 60 according to an embodiment of the present invention. The power clamp 60 comprises a trigger unit 64 formed with the diode chain 62 formed on a P-type substrate, PNP bipolar transistor B1, and a power clamp device 66 formed with an NMOS transistor N2.

Each P-type junction region is formed in a plurality of N-type junction regions to form a PN diode DI, wherein each diode DI is formed as a separate device by a device isolating film and connected as a line through a contact.

As described above, an embodiment of the present invention illustrates the diode chain 62 formed with three diodes DI. The number of the diodes DI is controlled depending on an operation voltage of an internal circuit to make it possible to control a turn-on voltage.

Meanwhile, in the PNP bipolar transistor B1, a P-type substrate becomes a collector and an N-type junction region forms a base, wherein a predetermined portion of the N-type junction region becomes an emitter as a P-type junction region.

Herein, the base is connected to the diode chain 62 and the emitter is connected to a power voltage line. The collector is also connected to a gate and a substrate of the NMOS transistor N2, which is the power clamp device 66, through the node ND1.

The NMOS transistor N2 has a drain and source formed as the N-type junction region, wherein the drain and source are connected to the power voltage line and the ground voltage line, respectively. The gate also drops the voltage via a resistor Rsub formed on the P-type substrate.

Figure 7:
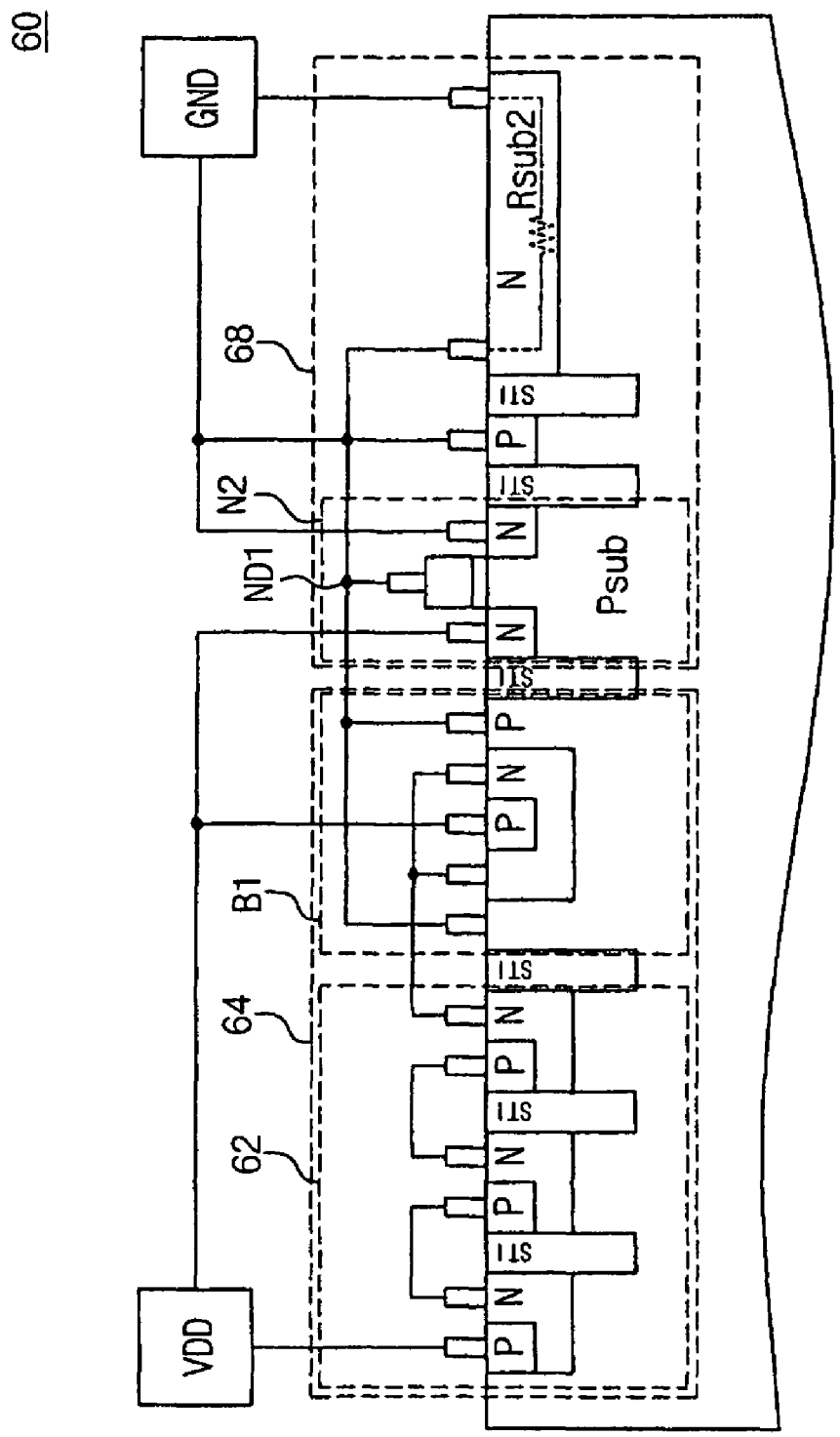
FIG. 7 is a cross-sectional view of the electro-static discharge protection device of FIG. 5a as formed according to another embodiment of the present invention.

Meanwhile, the power clamp unit of FIG. 5 formed as shown in FIG. 5b may also be formed as shown in FIG. 7. The explanation on those portions the same as FIG. 6 are omitted.

Specifically, FIG. 7 illustrates a power clamp unit 68 formed by forming a resistor previously formed on a P-type substrate in an N well region. This can reduce a leakage current, which is possibly generated from portions other than a current path flowing on the P-type substrate and the ground voltage line as shown in FIG. 6.

Therefore, the current path formed by the P-type substrate and the N well region has less change in the resistance value due to the reduction of the leakage current to provide a more stable operating electro-static discharge protection device.

Figure 8:
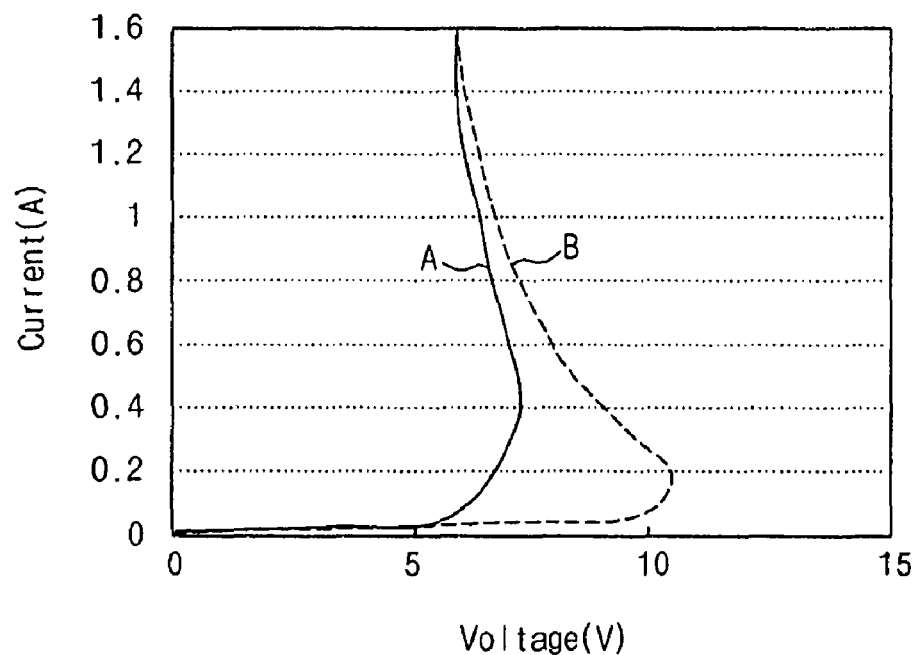
FIG. 8 is an operation waveform of a trigger voltage according to an embodiment of the present invention contrasted against an operation waveform view of a trigger voltage according to the prior art.

FIG. 8 shows an operation waveform view A of a power clamp unit 60 according to an embodiment of the present invention and an operation waveform view B according to the prior art. The operation waveform view A shows a low trigger voltage of about 7V due to a trigger unit formed of a diode and a bipolar transistor according to an embodiment of the present invention. The operation waveform view B shows a higher trigger voltage of about 11V according to the prior art.

Figure 9:
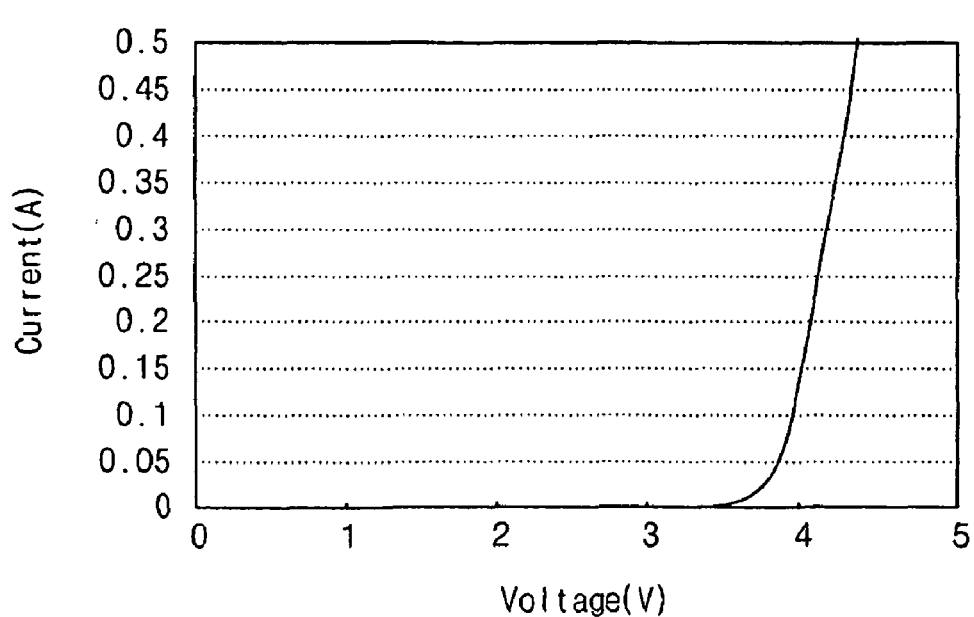
FIG. 9 is a waveform of an operation voltage of a diode chain according to an embodiment of the present invention.

FIG. 9 shows a waveform of an operation voltage of a diode chain helping an operation of the power clamp unit 60 according to an embodiment of the present invention. The diode chain formed of three diodes has a turn-on voltage of about 3.8V and it may be recognized for use in products having an internal circuit having an operation voltage of 2V or less.

Figure 10:
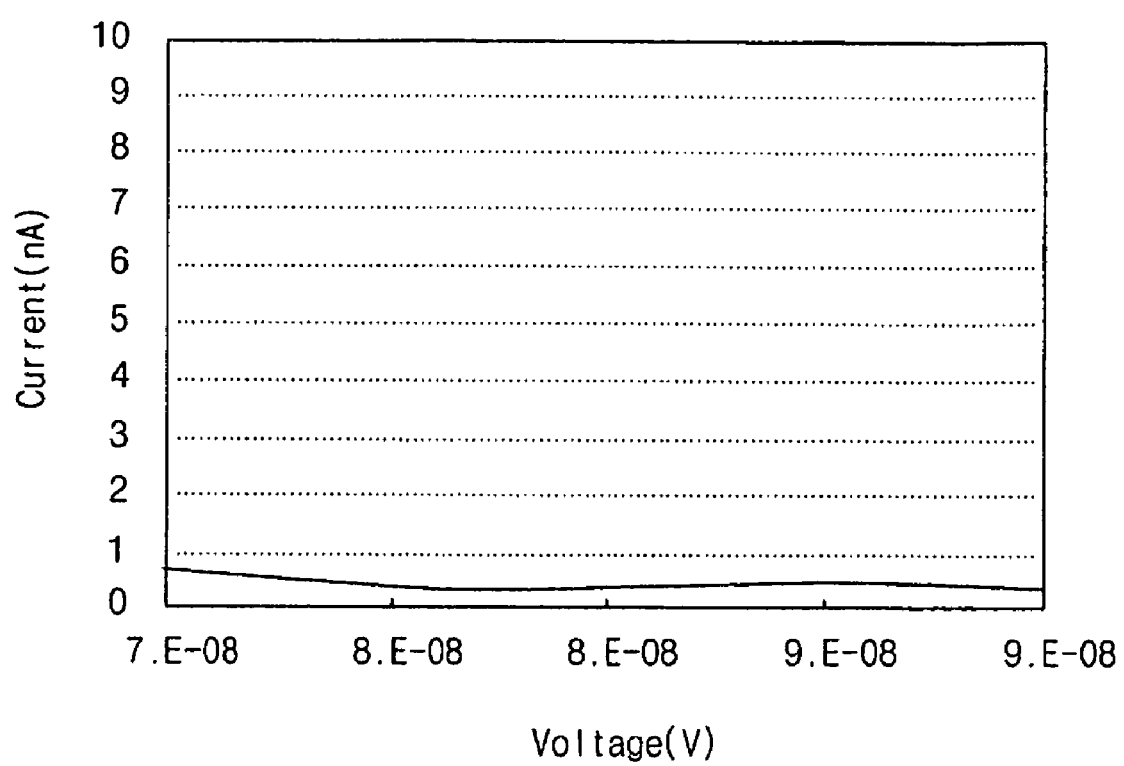
FIG. 10 is a waveform showing an amount of current leaked as time elapses according to an embodiment of the present invention.

FIG. 10 shows an amount of current leaked as time elapses when the operation voltage is about 1.5V. The power clamp unit including the diode chain and the bipolar transistor operates stably while having a low operation voltage since the signal, changing according to an exponential function, shows low leakage current properties of about 0.4 to 0.5 nA as time elapses.

Therefore, an electro-static discharge protection device according to an embodiment of the present invention provides an electro-static discharge protection device having a voltage drop element utilizing a bipolar transistor and a diode chain in order to have a low operation voltage.

A trigger unit formed of the bipolar transistor and the diode chain comprises the electrostatic discharge protection device. The trigger unit therefore has a small area and reduces a layout area of the electrostatic discharge device.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An electro-static discharge protection device having a power clamp unit providing a discharge path between a pair of power lines, the power clamp unit comprising:
   a trigger unit that generates a trigger voltage corresponding to electrostatic discharge accumulated in a first power line; and
   a power clamp device that is switched by the trigger voltage to form the discharge path to discharge electrostatic discharge in the first power line to a second power line,
   wherein the trigger unit comprises:
      a driving device including a chain of one or more diodes connected in series;
      a current amplifying device including a bipolar transistor whose emitter is connected to the first voltage line and collector is connected to the bulk,
      wherein the driving device is coupled to only a base of the bipolar transistor, and
   wherein the power clamp comprises a resistor for dropping the trigger voltage to apply to the bulk, and the resistor is coupled between a collector of the bipolar transistor and the second power line.

2. The electro-static discharge protection device as set forth in claim 1, wherein the power clamp device comprises an NMOS transistor having a gate coupled to a bulk.

3. The electro-static discharge protection device as set forth in claim 1, wherein the resistor is connected between the bulk of the NMOS transistor and the second power line.

4. The electro-static discharge protection device as set forth in claim 1, wherein the trigger unit comprises:
   the driving device detecting the minimum electrostatic discharge in the first power line and then providing a driving current corresponding thereto; and
   the current amplifying device providing the trigger voltage that is turned on by the driving current of the driving device so as to amplify the electrostatic discharge supplied to the bulk and the gate of the NMOS transistor.

5. The electro-static discharge protection device as set forth in claim 1, wherein the number of diodes in the diode chain is configured such that the diode chain has a larger total threshold voltage than the operation voltage of an internal circuit.

6. The electro-static discharge protection device as set forth in claim 1, wherein the current amplifying device comprises a PNP bipolar transistor.

7. The electro-static discharge protection device as set forth in claim 1, wherein the first power line is a power voltage line and the second power line is a ground voltage line.

* * * * *